United States Patent
Chikaki

(10) Patent No.: US 8,028,735 B2
(45) Date of Patent: Oct. 4, 2011

(54) LAMINATING APPARATUS

(75) Inventor: Yoshiro Chikaki, Tokyo (JP)

(73) Assignee: NPC Incorporated, Tokyo (JP)

( * ) Notice: Subject to any disclaimer, the term of this patent is extended or adjusted under 35 U.S.C. 154(b) by 370 days.

(21) Appl. No.: 11/979,876

(22) Filed: Nov. 9, 2007

(65) Prior Publication Data

US 2008/0115893 A1 May 22, 2008

(30) Foreign Application Priority Data

Nov. 16, 2006 (JP) ................................. 2006-309913

(51) Int. Cl.
*B30B 5/02* (2006.01)

(52) U.S. Cl. ..................... 156/382; 156/583.3

(58) Field of Classification Search .......... 156/538–579, 156/359, 379.9, 380.9, 581, 582, 583.1–583.91, 156/583.3, 382
See application file for complete search history.

(56) References Cited

U.S. PATENT DOCUMENTS

| 6,481,482 | B1 * | 11/2002 | Shimotomai | 156/366 |
| 2004/0171187 | A1 | 9/2004 | Kataoka et al. | |
| 2005/0056363 | A1 | 3/2005 | Takeyama | |

FOREIGN PATENT DOCUMENTS

| DE | 3827497 | A1 | 3/1990 |
| DE | 42 33 611 | A1 | 4/1994 |
| DE | 100 48 974 | A1 | 4/2002 |
| EP | 1 059 675 | A2 | 12/2000 |
| EP | 1550548 | A1 * | 7/2005 |
| FR | 2 587 273 | A1 | 3/1987 |
| JP | 7-323504 | A | 12/1995 |
| JP | 8-290479 | A | 11/1996 |
| JP | 10-095089 | A | 4/1998 |
| JP | 2000-349309 | A | 12/2000 |
| JP | 3655076 | B2 | 3/2005 |
| JP | 2006-088511 | A | 4/2006 |
| WO | WO-2007/116504 | A1 | 10/2007 |

OTHER PUBLICATIONS

European Search Report, App. No. 07021714.6-1528, Jun. 4, 2008(7 pages).

* cited by examiner

*Primary Examiner* — Katarzyna Wyrozebski Lee
*Assistant Examiner* — Scott W Dodds
(74) *Attorney, Agent, or Firm* — Rader, Fishman & Grauer PLLC

(57) ABSTRACT

There is provided a laminating apparatus laminating an object to be laminated by introducing a fluid into an upper chamber demarcated by a diaphragm and sandwiching and pressing the object to be laminated placed on a heater panel by the diaphragm expanded by the introduced fluid, the apparatus including: a tank part in which the fluid to be introduced into the upper chamber is stored; and a heating mechanism heating the fluid stored in the tank part.

6 Claims, 12 Drawing Sheets

LAMINATING APPARATUS

BACKGROUND OF THE INVENTION

1. Field of the Invention

The present invention relates to a laminating apparatus particularly suitable for producing a laminated object in a thin plate shape such as a solar battery module.

2. Description of the Related Art

In recent years, various developments have been made on solar batteries with the aim of effective use of solar energy. Further, beside crystal type solar batteries using single crystal silicon or polycrystalline silicon, various types of solar batteries have been contrived, such as amorphous solar batteries using amorphous silicon (noncrystalline silicon). However, since silicon itself in any of these crystalline and amorphous types is subject to chemical change and has low resistance against a physical impact, a solar battery module in which silicon is laminated with a transparent vinyl film, tempered glass, heat-resistant glass, or the like is generally used.

Further, for use as building materials, an integrated module and the like in which an exterior wall material or a roof material is integrated with a solar battery module have come to be produced in recent years. A method to laminate a solar battery module is to interpose strings (solar battery cells) between a vinyl film or glass and a back sheet via a filler such as, for example, EVA (ethylene vinyl acetate) resin, and melt the filler by temperature given by heating under vacuum.

Conventionally, as a laminating apparatus for producing such solar battery modules and the like, there has been known a laminating apparatus which laminates an object to be laminated in a laminating part having a diaphragm on an upper side and a heater panel on a lower side, by melting a filler inside the object to be laminated and pressing the object to be laminated sandwiched between the diaphragm and the heater panel. Regarding such a laminating apparatus, the present applicant has disclosed "a laminating apparatus" in Japanese Patent Publication No. 3655076. In such a laminating apparatus, a solar battery module is placed on a heater panel in a pressure-reduced state and the atmosphere is introduced into an upper chamber above a diaphragm, whereby the solar battery module is sandwiched and pressed between an upper surface of the heater panel and a lower surface of the diaphragm.

SUMMARY OF THE INVENTION

However, when the sandwiched solar battery module is pressed in the above-described manner, the room-temperature atmosphere is introduced into the upper chamber, and therefore, there has been a concern that an upper surface of the solar battery module might be cooled via the diaphragm. Further, during the laminating treatment, the temperature of the upper surface of the solar battery module which is in contact with the diaphragm is low and the temperature of a lower surface of the solar battery module which is in contact with the heater panel is high, and therefore, there has been a concern that the product might warp due to the temperature difference. Moreover, since conditions of a laminator in winter and in summer differ due to difference in the temperature of the atmosphere introduced into the upper chamber depending on seasons, there has been a concern about unstable quality of the products.

The present invention was made in view of the aforesaid problems, and its object is to provide a laminating apparatus capable of preventing an upper surface of a solar battery module from being cooled during laminating treatment and thus capable of producing products with stable quality irrespective of seasons.

To solve the aforesaid problems, according to the present invention, there is provided a laminating apparatus laminating an object to be laminated by introducing a fluid into an upper chamber demarcated by a diaphragm and sandwiching and pressing the object to be laminated placed on a heater panel by the diaphragm expanded by the introduced fluid, the apparatus including a tank part in which the fluid to be introduced into the upper chamber is stored; and a heating mechanism heating the fluid stored in the tank part.

The heating mechanism is, for example, a heater heating the fluid in the tank part while circulating the fluid. Further, the heating mechanism is, for example, a heater attached to the tank part.

The tank part may be disposed adjacent to the upper chamber. The laminating apparatus may further include a lift mechanism lifting up/down the object to be laminated between a position on the heater panel and a position apart upward from the heater panel. The object to be laminated is, for example, a solar battery module.

According to the present invention, since the pre-heated fluid in the tank part is introduced into the upper chamber when the sandwiched object to be laminated such as a solar battery module is pressed, the object to be laminated is not cooled. Therefore, no temperature difference occurs in the object to be laminated, which enables the production of products with stable quality. Further, the introduction of the heated fluid into the upper chamber makes it possible to shorten the time taken to increase the temperature of the object to be laminated, resulting in a reduction in the time of the laminating treatment. This enables a reduction in the treatment time, resulting in improved production efficiency. Further, according to the present invention, since the temperature of the fluid introduced into the upper chamber can be constant irrespective of seasons, conditions of a laminator in winter, summer, and so on are constant, resulting in stable quality of the products.

DETAILED DESCRIPTION OF THE INVENTION

Figure 1:
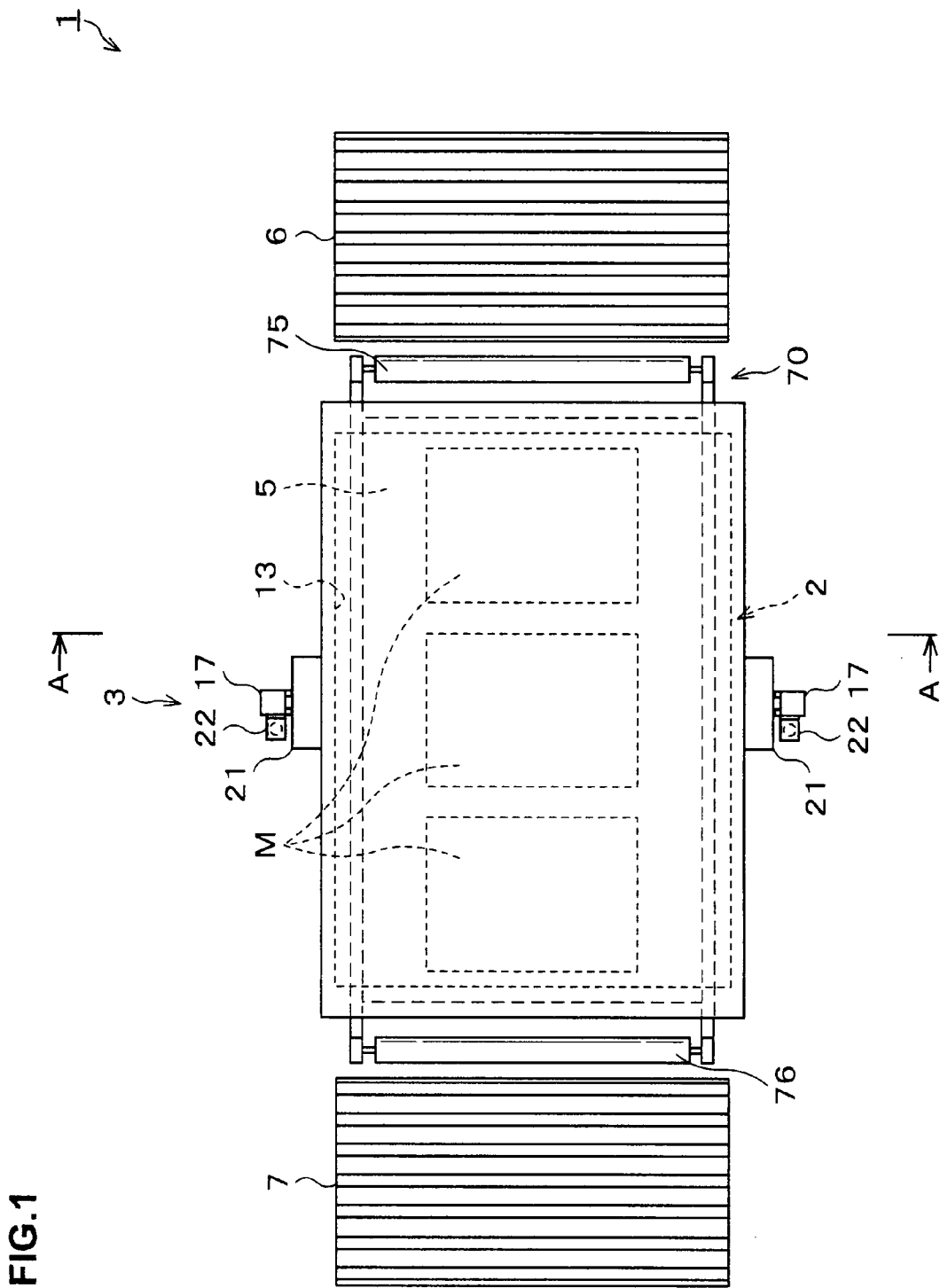
FIG. 1 is a plane view of a laminating apparatus according to an embodiment of the present invention.

Hereinafter, a preferred embodiment of the present invention will be described based on a laminating apparatus 1 suitable for laminating a solar battery module M as an example of an object to be laminated. In the specification and the drawings, elements having substantially the same functions and structures will be denoted by the same reference numerals, and redundant description thereof will be omitted.

Figure 2:
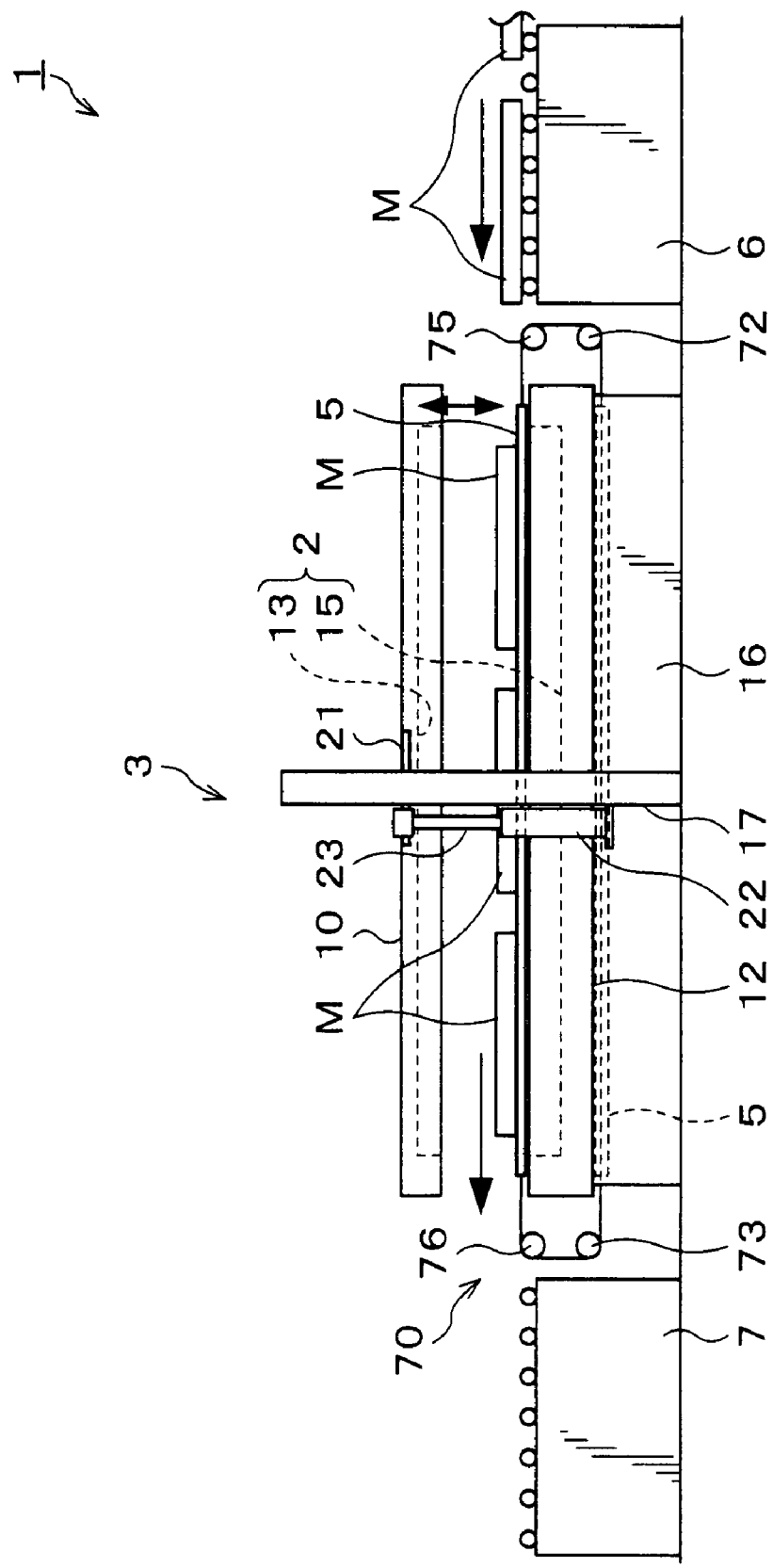
FIG. 2 is a side view of the laminating apparatus according to the embodiment of the present invention.

As shown in FIG. 1 and FIG. 2, the laminating apparatus 1 includes a laminating unit 3 which has therein a laminating part 2. In the shown example, the laminating part 2 is capable of simultaneously laminating a plurality of (for example, three) objects to be laminated. Further, for example, the laminating part 2 is formed large enough to laminate an object to be laminated which is about 2150 wide in a right and left direction and about 4000 mm wide in a front and rear direction, at the maximum.

The laminating apparatus 1 includes a conveying sheet 5 conveying, for example, three solar battery modules M placed thereon into the laminating unit 3, and conveying, out of the laminating unit 3, the solar battery modules M which have been laminated. On the right of the laminating unit 3, provided is a supply conveyor 6 from which the solar battery modules M to be laminated are conveyed toward the laminating unit 3. On the left of the laminating unit 3, provided is an unloading conveyor 7 to which the solar battery modules M are unloaded out of the laminating unit 3. The solar battery modules M are conveyed leftward in FIG. 1 and FIG. 2 as they are transferred to the supplier conveyor 6, the conveying sheet 5, and the unloading conveyor 7 in sequence.

As shown in FIG. 2, the laminate unit 3 includes an upper case 10 and a lower case 12. An upper chamber 13 is formed inside the upper case 10, and a lower chamber 15 is formed inside the lower case 12. The laminating part 2 is constituted of the upper chamber 13 and the lower chamber 15.

The lower case 12 is fixedly supported on an upper side of a base 16. Brackets 21 are provided to be movable along support pillars 17 erected on a front side and a back side (a near side and a far side in FIG. 2) of the base 16, and a front side and a back side of the upper case 10 are fixed to the brackets 21. This structure allows the upper case 10 to move up/down along the support pillars 17, and to move up/down above the lower case 12 while kept parallel with the lower case 12.

Hydraulic cylinders 22 are provided on sides of the respective support pillars 17, and tips of piston rods 23 of the cylinders 22 are connected to lower surfaces of the brackets 21 fixed to the upper case 10. Accordingly, when the piston rods 23 extend by the operation of the cylinders 22, the upper case 10 moves up to separate from an upper surface of the lower case 12, so that the laminating part 2 constituted of the upper chamber 13 and the lower chamber 15 becomes open. On the other hand, when the piston rods 23 contract by the operation of the cylinders 22, the upper case 10 moves down to come into close contact with the upper surface of the lower case 12, so that the laminating part 2 is hermetically closed.

Figure 3:
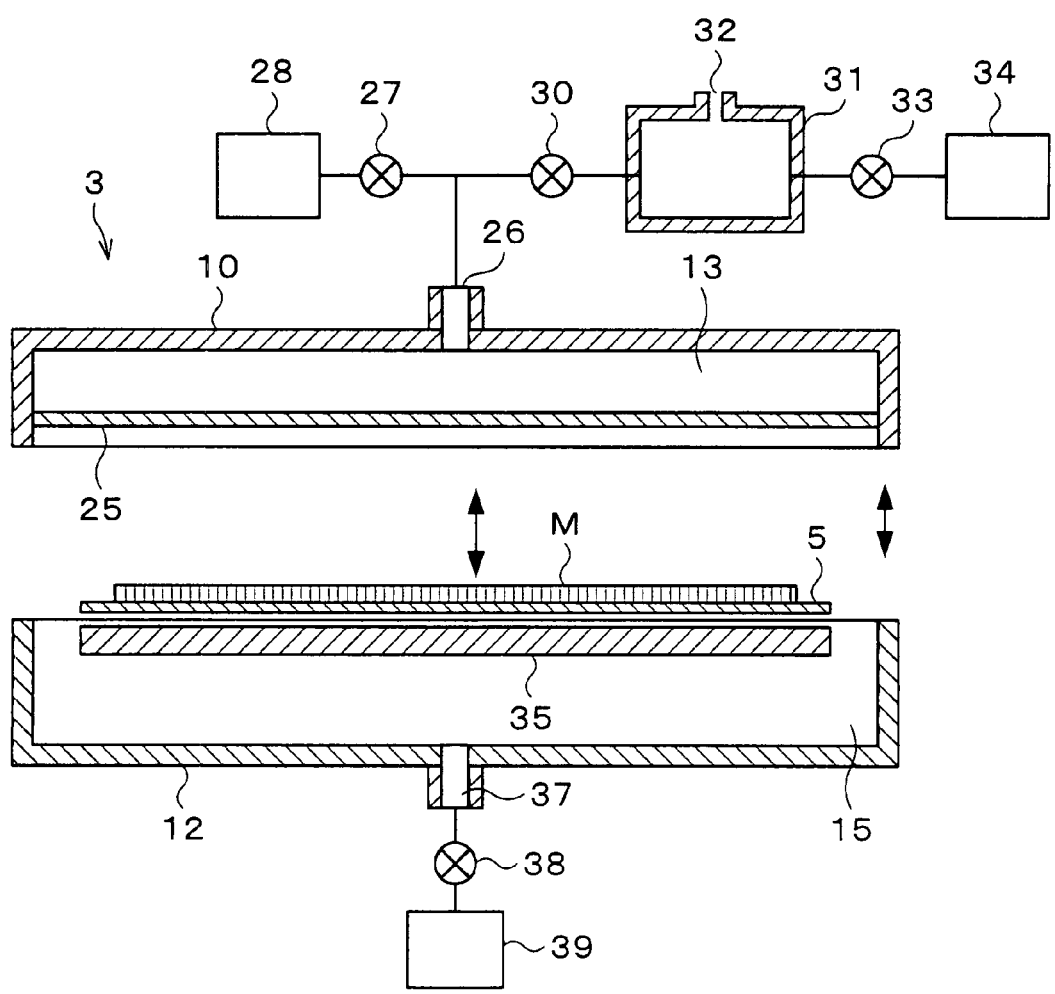
FIG. 3 is a sectional view taken along the arrows A-A in FIG. 1, and shows a state where an upper case is lifted up to open a laminating part.
Figure 4:
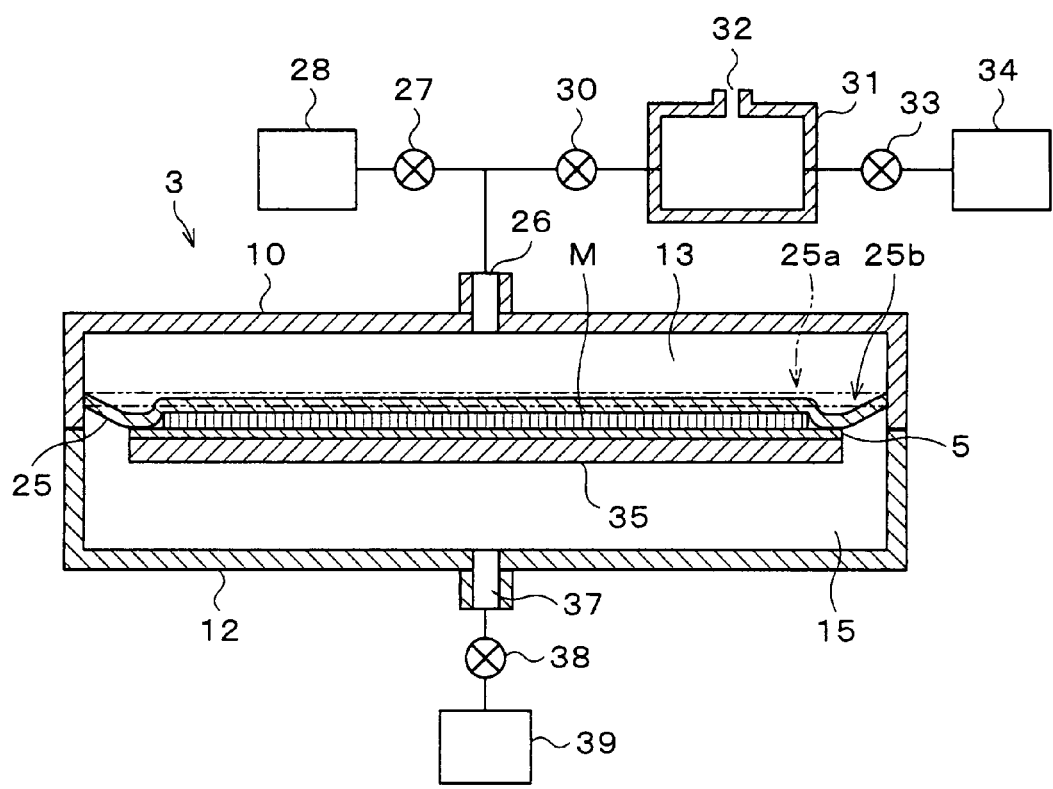
FIG. 4 is a sectional view taken along the arrows A-A in FIG. 1, and shows a state where the upper case is lowered to hermetically close the laminating part.

As shown in FIG. 3, an expandable diaphragm 25 is fitted so as to horizontally partition the inside of the upper case 10, and a space enclosed by the diaphragm 25 and an inner wall surface of the upper case 10 constitutes the upper chamber 13. Further, as shown in FIG. 4, while the laminating part 2 is hermetically closed by the upper case 10 being lowered, a space enclosed by the diaphragm 25 and an inner wall surface of the lower case 12 constitutes a lower chamber 15. As the diaphragm 25, an elastic material such as a silicon diaphragm, a butyl diaphragm, or the like is used, for instance. An inlet/outlet port 26 is provided in an upper surface of the upper case 10 to communicate with the upper chamber 13.

A vacuum pump 28 and a tank part 31 are connected to the inlet/outlet port 26 via a valve 27 and via a valve 30 respectively. With the vacuum pump 28, it is possible to evacuate the inside of the upper chamber 13 and to introduce air into the upper chamber 13 from the tank part 31.

An air supply port 32 for taking in outside air into the tank part 31 is formed in a side surface of the tank part 31. Further, a heater 34 is connected to the tank part 31 via a valve 33. The heater 34 is constituted by, for example, a hot-wind fan or the like. When the valve 33 is opened, air in the tank part 31 circulates by the heater 34, and the air heated by the heater 34 is stored in the tank part 31.

A heater panel 35 is provided in the lower case 12. The heater panel 35 is structured such that heaters (not shown) are provided inside a metal plate made of, for example, aluminum. An inlet/outlet port 37 is provided in a lower surface of the lower case 12 so as to communicate with the lower chamber 15. A vacuum pump 39 is connected to the inlet/outlet port 37 via a valve 38. With the vacuum pump 39, it is possible to evacuate the inside of the lower chamber 15 and to introduce air into the lower chamber 15 from the inlet/outlet port 37.

When an internal pressure of the upper chamber 13 and an internal pressure of the lower chamber 15 are made different so that the former becomes higher than the latter, in a state where the laminating part 2 is hermetically closed by the upper case 10 being lowered and in close contact with an upper surface of the lower case 12 as shown in FIG. 4, the diaphragm 25 bulges out from the state shown by the two-dot chain line 25a in FIG. 4 to the state shown by the solid line 25b in FIG. 4 and pushes the object to be laminated M against the heater panel 35, so that the sandwiched object to be laminated M is pressed.

Figure 5:
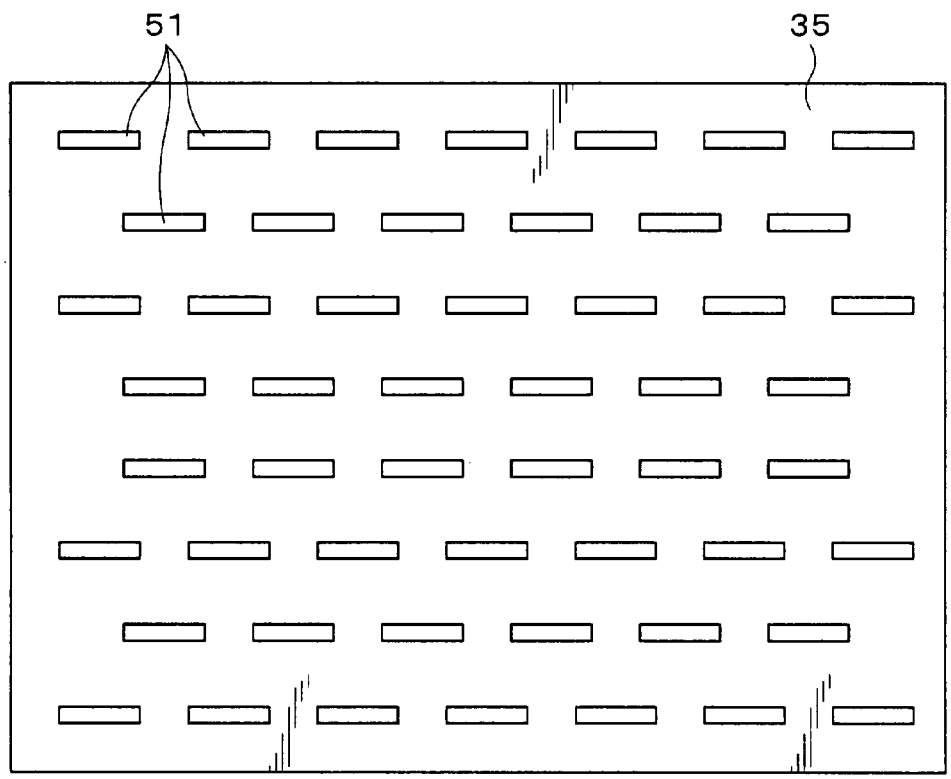
FIG. 5 is a plane view of a heater panel.
Figure 6:
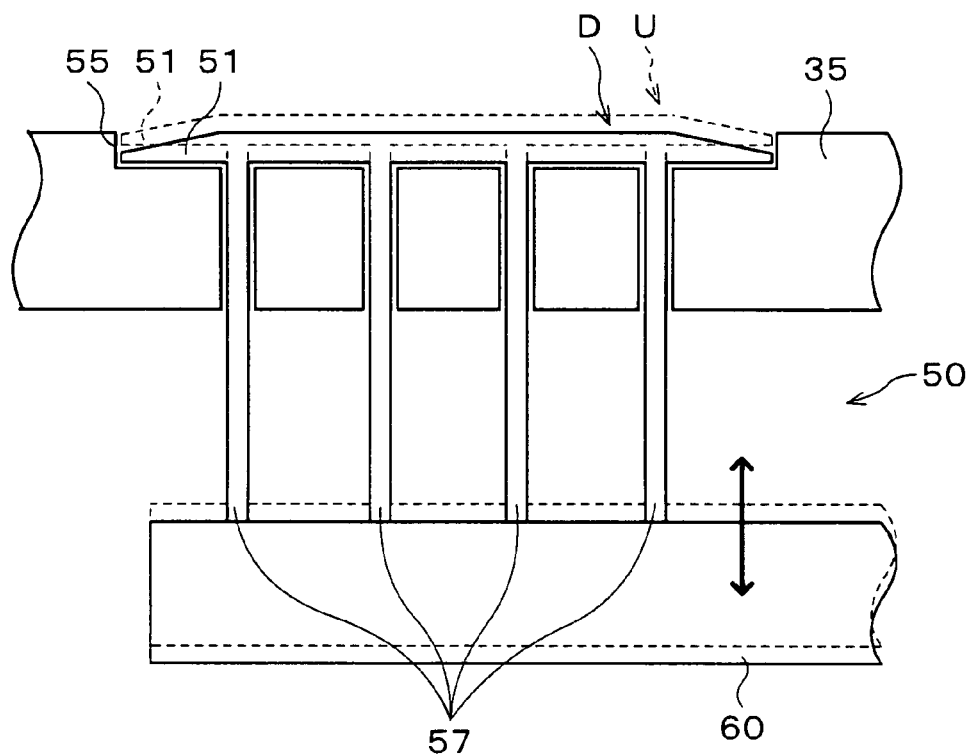
FIG. 6 is an enlarged fragmentary view of the heater panel, and shows the structure of a support part in an enlarged manner.

As shown in FIGS. 5 and 6, on an upper surface of the heater panel 35, support parts 51 of a lift mechanism 50 lifting up/down the solar battery module M via a conveying sheet 5 are provided to be movable up/down. The lift mechanism 50 includes the plural support parts 51, and when the support parts 51 are simultaneously lifted up/down, the solar battery module M placed on the upper surface of the heater panel 35 via the conveying sheet 5 can be lifted up/down between a position on the heater panel 35 and a position apart upward from the heater panel 35.

Each of the support parts 51 of the lift mechanism 50 has a shape which is long in a loading/unloading direction X of the solar battery module M. On the upper surface of the metal plate 35, recessed portions 55 in which the respective lowered support parts 51 are housed are formed. The support parts 51 are supported by shafts 57 vertically passing through the heater panel 35, and lower ends of the shafts 57 are supported on a horizontal support plate 60 moving up/down under the heater panel 35. The plural support parts 51 included in the lift mechanism 50 are all placed on the common support plate 60, and the up/down movement of the support plate 60 by a driving mechanism such as, for example, an air cylinder (not shown) enables the simultaneous up/down movement of all the plural support parts 51. Alternatively, the support parts 51 may be coupled to the support plate 60.

Figure 7:
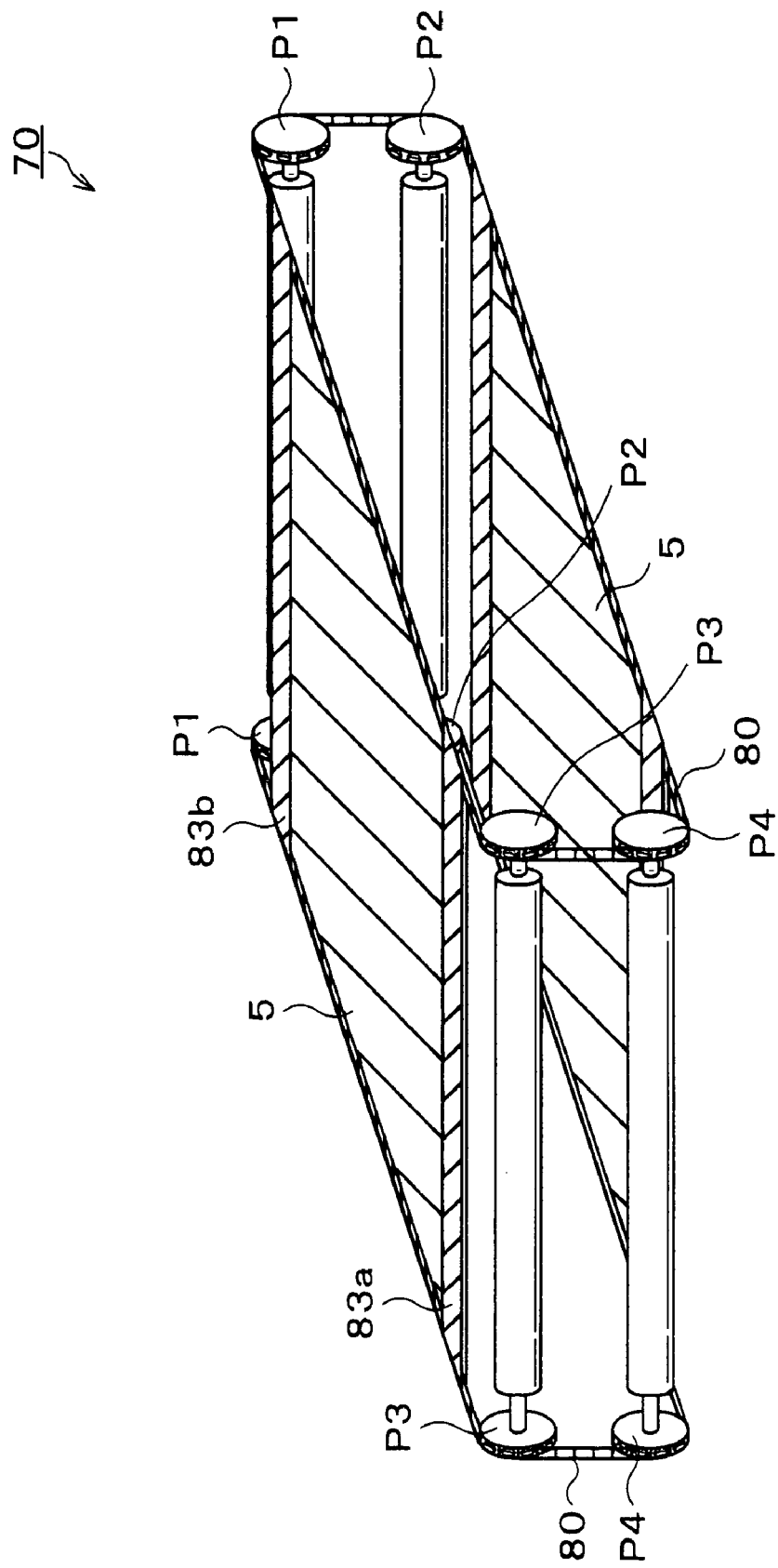
FIG. 7 is an explanatory perspective view of the structure of a conveying sheet moving mechanism.

As shown in FIG. 7, when the support plate 60 is in a lowered state, the support parts 51 are at a down position D and are housed in the recessed portion s55, and the upper surfaces of the support parts 51 are substantially flush with the upper surface of the heater panel 35. In this case, the solar battery module M placed on the conveying sheet 5 comes into thermal contact with the heater panel 35 via the conveying sheet 5. On the other hand, when the support plate 60 is in a raised state, the support parts 51 are at an up position U and protrude upward from the upper surface of the heater panel 35. In this case, the solar battery module M placed on the conveying sheet 5 is lifted up and is not in thermal contact with the heater panel 35.

As shown in FIG. 7, the conveying sheet 5 conveying the solar battery module M into/out of the laminating part 2 while placing the solar battery module M thereon alternately circulates above and under the lower case 12 of the laminating unit 3 by the operation of a conveying sheet moving mechanism 70. The conveying sheet moving mechanism 70 is structured such that endless chains 80 are wound around a driving pulley P1 and driven pulleys P2 to P4 which are arranged in pairs outside the laminating part 2 on the right and left thereof. Each of these driving pulley P1 and driven pulleys P2 to P4 includes a pair of pulleys on whose outer circumferential surfaces sprockets engaged with the endless chains 80 are formed.

The driving pulley P1 and the driven pulley 3 are provided at the same height, and thereunder, the driven pulley P2 and the driven pulley P4 are provided at the same height. The driven pulley P2 is provided under the driving pulley P1, and the driven pulley P4 is provided under the driven pulley P3. Between the right and left endless chains 80, 80, four crossbeam members 83a to 83d in a flat plate shape are provided at predetermined intervals. These crossbeam members 83a to 83d are fixed in such a manner that their both end portions have, for example, a hook shape and are hooked to the endless chains 80, 80. The conveying sheets 5 are provided at two positions, i.e., between the crossbeam member 83a and the crossbeam member 83b and between the crossbeam member 83c and the crossbeam member 83d. With this structure, the two conveying sheets 5 alternately move above and under the heater panel 35 by the intermittent circulation movement of the endless chains 80. Since the crossbeam members 83a to 83d can be fixed with their both end portions hooked to the endless chains 80, 80, it is possible to easily exchange the conveying sheets 5.

The surface of each of the conveying sheets 5 is preferably formed of a material excellent in removability to which the filler does not easily attach and from which the attached filler can be easily removed, in order to prevent the filler squeezed out of the solar battery modules M from adhering to the surface when the solar battery module M in the sandwiched state is pressed by the diaphragm 25 in the laminating part 2. A heat-resistant glass cloth sheet or the like coated with, for example, Teflon® (fluorocarbon resin) is preferably used as the conveying sheet 5. Alternatively, the surface of the conveying sheet 5 may be coated with a material excellent in removability such as fluorocarbon resin, for example.

Figure 8:
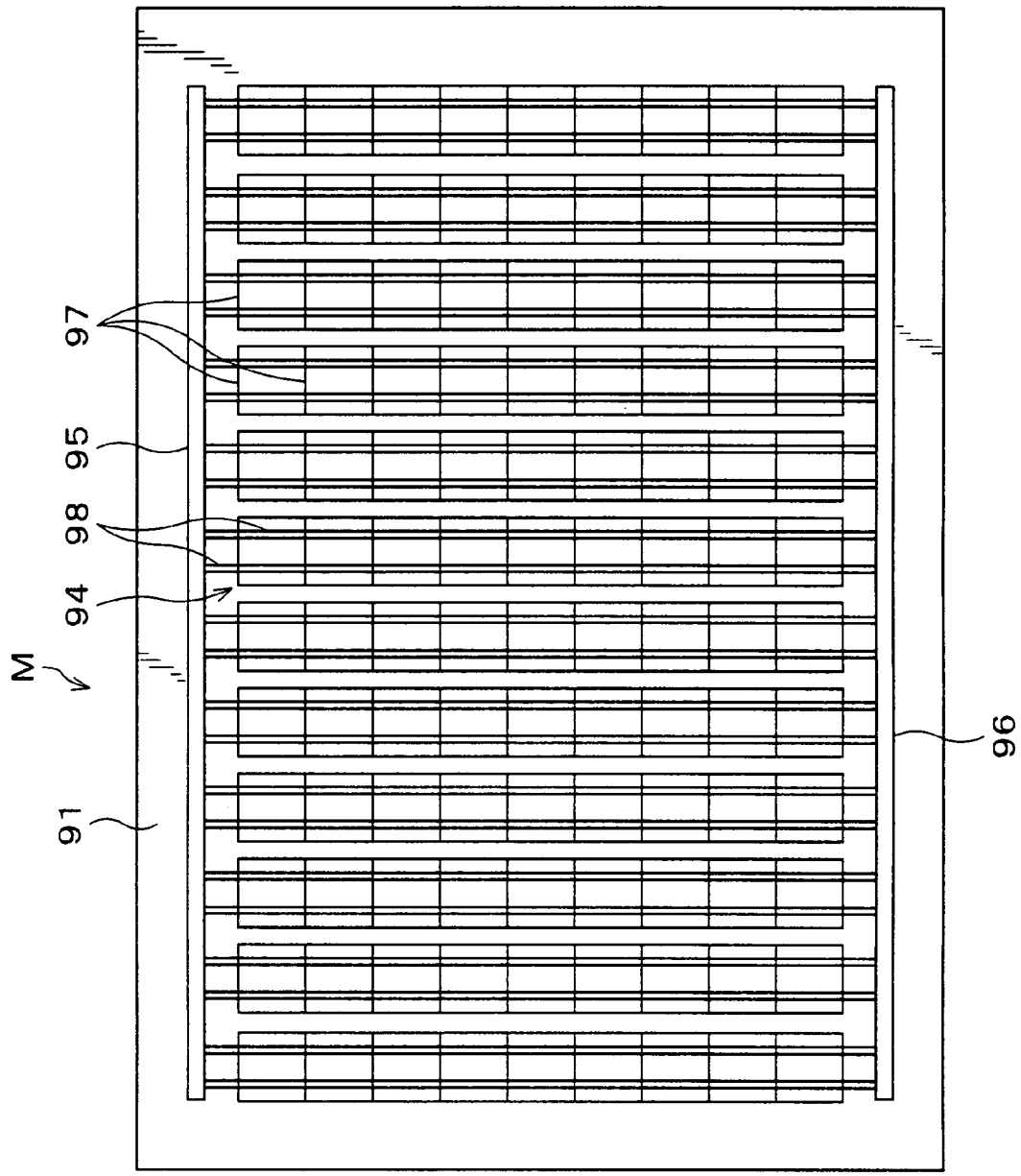
FIG. 8 is a plane view of a solar battery module.
Figure 9:
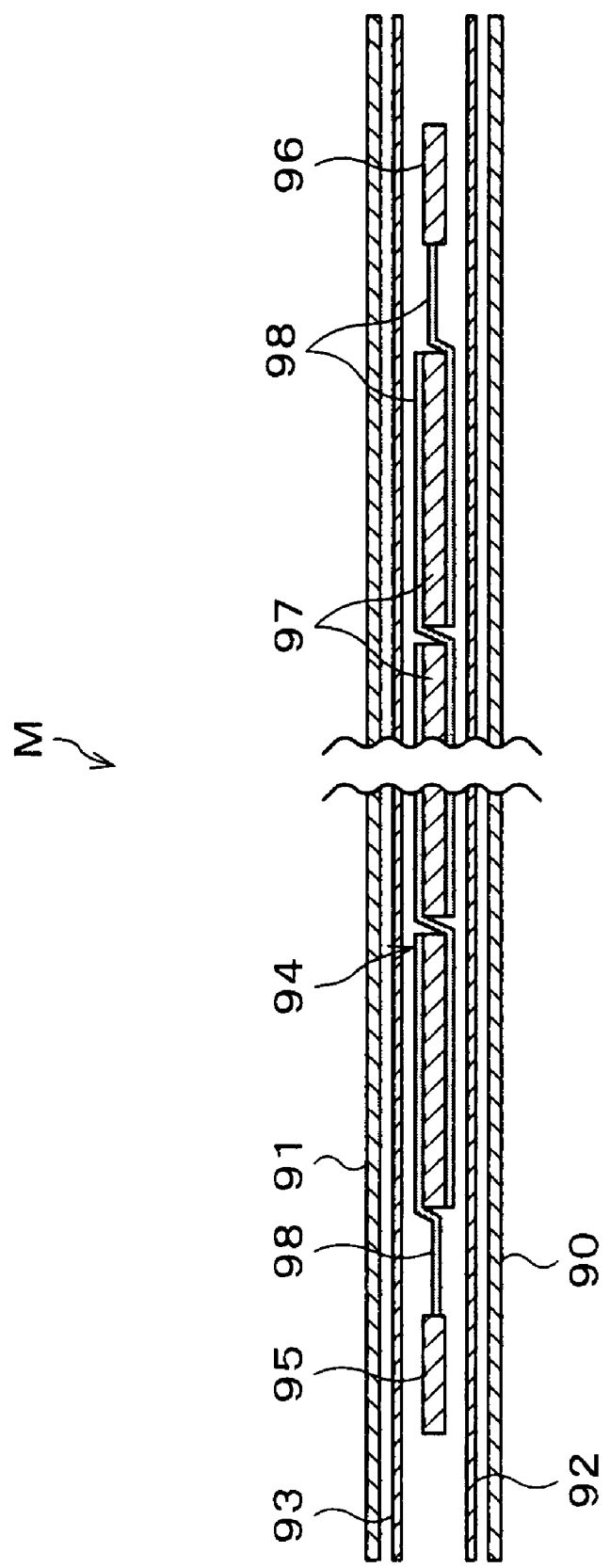
FIG. 9 is an enlarged sectional view of the solar battery module M.

FIGS. 8 and 9 show the solar battery module M as one example of the laminated object which is favorably produced by the laminating apparatus 1 according to the embodiment of the present invention. The solar battery module M is formed in a rectangular thin plate shape.

The solar battery module M is structured such that strings 94 are sandwiched between a transparent cover glass 90 disposed on a lower side and a protective material 91 disposed on an upper side, via fillers 92 and 93. As the protective material 91, a transparent material such as PE resin is used, for instance. As the fillers 92 and 93, EVA (ethylene vinyl acetate) resin or the like is used, for instance. Each of the strings 94 includes solar battery cells 97 which are connected between electrodes 95 and 96 via lead wires 98. Front surfaces (light receiving surfaces) and back surfaces of the solar battery cells 97 are covered with the cover glass 90 on the lower side and with the protective material 91, respectively.

The solar battery module M as the laminated object structured as above is produced by the laminating apparatus 1 of the embodiment of the present invention according to the following procedure.

First, the solar battery module M to be laminated is positioned on and supplied to the supply conveyor 6 which is disposed on the right of the laminating part 2 in FIG. 1, by means such as a robot not shown. The solar battery module M is supplied to the supply conveyor 6 of the laminating apparatus 1, with the protective material 91 shown in FIGS. 8 and 9 facing upward.

By the operation of the supply conveyor 6, the solar battery module M supplied to the supply conveyor 6 is placed on the conveying sheet 5 which is set in advance on the right of the laminating part 2. Then, the driving pulley P1 of the conveying sheet moving mechanism 70 is driven, so that the solar battery module M is conveyed into the laminating part 2 together with the conveying sheet 5. The heater panel 35 of the laminating part 2 is kept at a constant temperature (for example, 150° C. or 160° C.) by the built-in heaters (not shown), enabling uniform heating on the upper surface of the heater panel 35.

Before the solar battery module M is conveyed into the laminating part 2 by the conveying sheet 5, the laminating part 2 is opened by lifting up the upper case 10. The operation of lifting up the upper case 10 is caused by the extension operation of the cylinders 22 described in FIG. 1. Further, the support parts 51 of the lift mechanism 50 are lifted up to be disposed at the up position U shown in FIG. 6 before the conveying sheet 5 reaches the laminating part 2. When entering the laminating part 2, the conveying sheet 5 having the solar battery module M thereon is conveyed thereto while being lifted up so as to be apart from the upper surface of the heater panel 35 by the support parts 5 which have been positioned at the up position U.

After the loading is finished and the conveying sheet 5 having the solar battery module M thereon is disposed above the heater panel 35, the upper case 10 is lowered to hermetically close the laminating part 2. The operation of lowering the upper case 10 is caused by the contraction operation of the cylinders 22 described in FIG. 1. Then, the inside of the upper chamber 13 is evacuated by the vacuum pump 28 while the valve 27 is opened and the valve 30 is closed, and at the same time, the inside of the lower chamber 15 is evacuated by the vacuum pump 39 while the valve 38 is opened. In this manner, the inside of the upper chamber 13 and the inside of the lower chamber 15 are simultaneously evacuated via the inlet/outlet ports 26, 37.

During or before this evacuation of the inside of the upper chamber 13 and the inside of the lower chamber 15, the valve 33 is opened and the air in the tank part 31 is circulated by the heater 34. Consequently, the air heated by the heater 34 is stored in the tank part 31.

After the inside of the upper chamber 13 and the inside of the lower chamber 15 are evacuated to, for example, 0.7 Torr to 1.0 Torr, the support parts 51 of the lift mechanism 50 are lowered to the down position D shown in FIG. 6 in the lower chamber 15. Consequently, the conveying sheet 5 which has been lifted up comes into contact with the upper surface of the heater panel 35, and the solar battery module M on the conveying sheet 5 is brought into thermal contact with the upper surface of the heater panel 35 to be heated. This heating promotes a chemical reaction of the EVA resin as the fillers 92, 93 in the solar battery modules M, causing bridging.

Then, in this state, the valve 27 is closed and the valve 30 is opened, so that the pre-heated air stored in the tank part 31 is introduced into the upper chamber 13 via the inlet/outlet port 26. Consequently, the diaphragm 25 is expanded downward in the laminating part 2, so that the solar battery module M is sandwiched and pressed between the upper surface of the heater panel 35 and the diaphragm 25.

Incidentally, when the heated air in the tank part 31 is thus introduced into the upper chamber 13, outside air is taken into the tank part 31 via the air supply port 32. The air thus taken into the tank part 31 is circulated by the heater 34, and the air heated by the heater 34 is stored in the tank part 31 again.

Then, after the laminating treatment is finished by heating and pressing in the laminating part 2 to produce the solar battery module M, atmospheric pressure is introduced into the lower chamber 15 via the inlet/outlet port 37. Then, the upper case 10 is lifted up to open the laminating part 2. The operation of lifting up the upper case 10 is caused by the extension operation of the cylinders 22 described in FIG. 1.

Then, after the support parts 51 of the lift mechanism 50 are lifted up to the up position U, the driving pulley P1 is driven, so that the solar battery module M is conveyed out of the laminating part 2 together with the conveying sheet 5. The conveying sheet 5 having the solar battery module M thereon is conveyed out of the laminating part 2 while being lifted up to the position above the heater panel 35 by the support parts 51 raised to the up position U.

The solar battery module M having undergone the laminating treatment is unloaded to the unloading conveyor 7 disposed on the left of the laminating part 2 in FIG. 1, by the operation of the conveying sheet 5 and the unloading conveyor 7. Then, the solar battery module M is taken out from the unloading conveyor 7 by means such as a robot not shown and is conveyed to the next process. Incidentally, when the solar battery module M having undergone the laminating treatment is thus unloaded to the unloading conveyor 7, a solar battery module M to be laminated next may be loaded into the laminating part 2 at the same time.

According to the above-described embodiment, the pre-heated air stored in the tank part 32 is introduced into the upper chamber 13, and therefore, the solar battery module M is not cooled when sandwiched and pressed. This eliminates a temperature difference in the solar battery module M, which makes it possible to produce products with stable quality. Further, since the solar battery module M is prevented from being cooled, it is possible to quickly raise the temperature up to a reaction temperature of EVA resin or the like as the fillers 92, 93. This can shorten the laminating treatment time, resulting in improved production efficiency. Further, since the temperature of the air introduced into the upper chamber 13 can be constant irrespective of seasons, conditions of a laminator are constant in winter, summer, and so on, resulting in stable product quality.

In addition, when the solar battery module M is loaded into the laminating part 2, the solar battery module M placed on the conveying sheet 5 is lifted up to be apart from the heater panel 35, which can prevent the solar battery module M from being heated by the heater panel 35 of the laminating part 2 before the completion of the loading of the solar battery module M. This can eliminate a difference in heating time among the solar battery module M loaded first and the solar battery modules M loaded later, in a case where, for example, the plural solar battery modules M are treated in the laminating part 2, and thus enables heating of the plural solar battery modules M to uniform temperature. Further, it is possible to prevent the occurrence of bubbles in the solar battery module M which might be caused if the solar battery module M were heated before the laminating treatment, and accordingly, it is possible to produce higher quality solar battery modules M than was possible conventionally.

Hitherto, a preferred embodiment of the present invention has been described with reference to the attached drawings, but the present invention is not limited to such an example. It is obvious that those skilled in the art could reach various modification examples and corrected examples within the technical idea described in the claims, and it should be understood that these examples also belong to the technical scope of the present invention.

Figure 10:
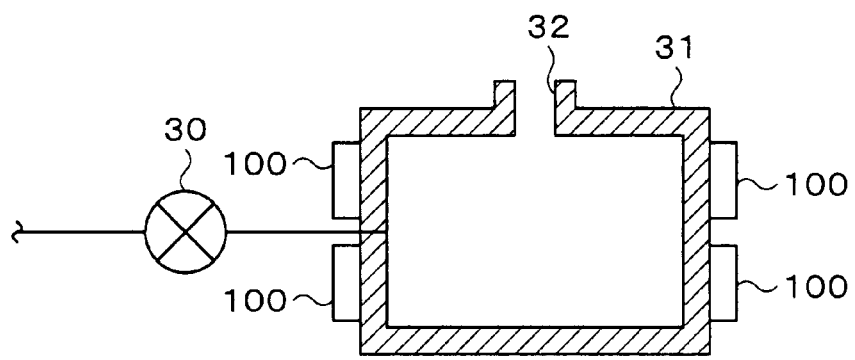
FIG. 10 is an explanatory view of a tank part with heaters attached to its outer surface.

The above embodiment describes the case where the air in the tank part 31 is circulated by the heater 34 to be heated, but heaters 100 may be attached to the tank part 31 as shown in FIG. 10, and the air in the tank part 31 may be heated by the heat of the heaters 100. In this case, as the heaters 100, rubber heaters or the like are usable, for instance.

Figure 11:
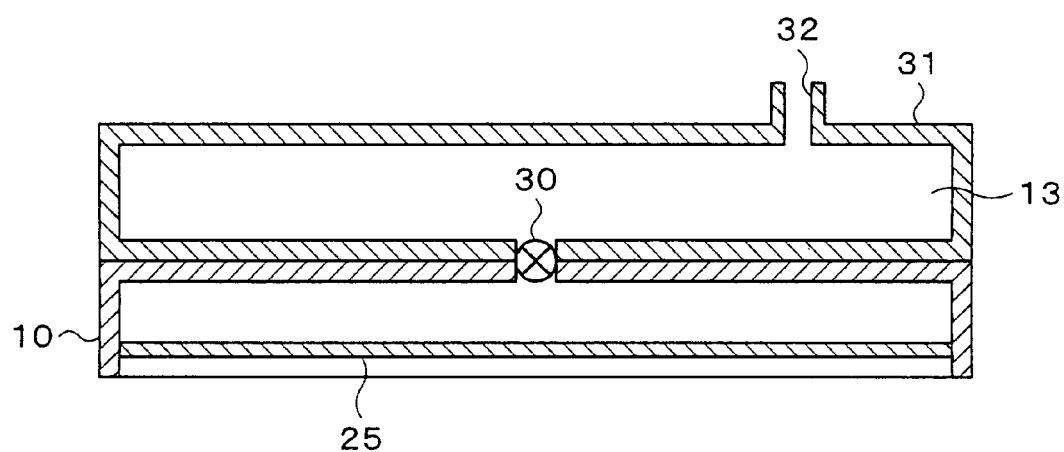
FIG. 11 is an explanatory view of an upper case with a tank part provided adjacent to an upper chamber.

Further, the tank part 31 may be disposed adjacent to the upper case 10 constituting the upper chamber 13 as shown in FIG. 11. If the tank part 31 and the upper chamber 13 are disposed adjacent to each other as shown in FIG. 11, the upper case 10 is also heated together with the tank part 31, which can more surely prevent the solar battery module M from being cooled when the sandwiched solar battery module M is pressed.

The number of the solar battery modules M simultaneously loaded to and treated in the laminating part 2 may be one, or any plural number. Further, the fluid introduced into the upper chamber 13 from the tank part 31 is not limited to air, but may be gas or the like such as inert gas, or may be a fluid other than gas, such as liquid. The interior content of the tank part 31 is preferably as large as that of the upper chamber 13 or more (for example, about twice as large as that of the upper chamber 13), so as to enable the introduction of a sufficient amount of the fluid into the upper chamber 13 from the tank part 31 during the laminating treatment.

Example

Figure 12:
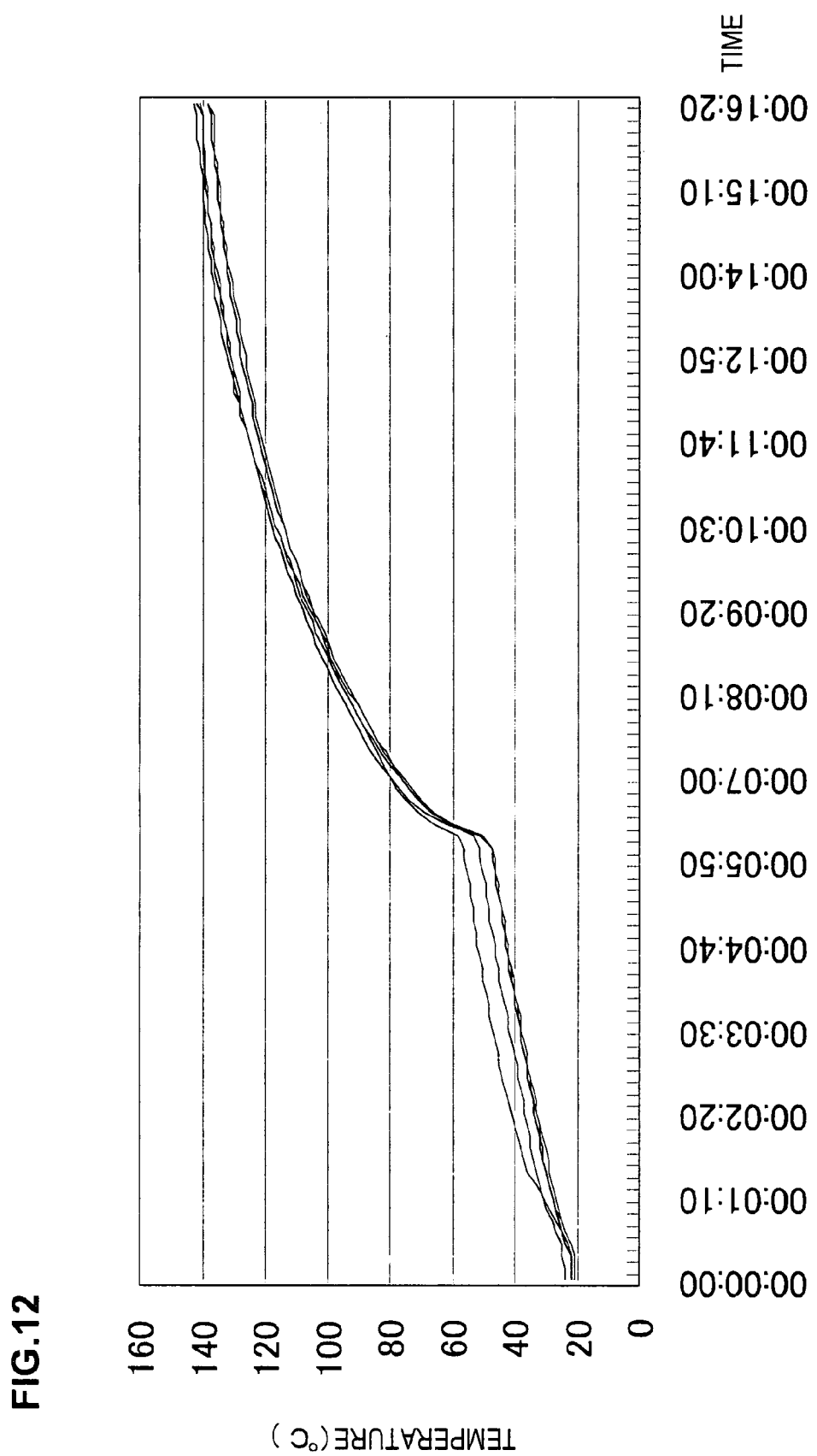
FIG. 12 is a graph showing temperature changes of the solar battery modules during the laminating treatment, according to an example of the present invention.
Figure 13:
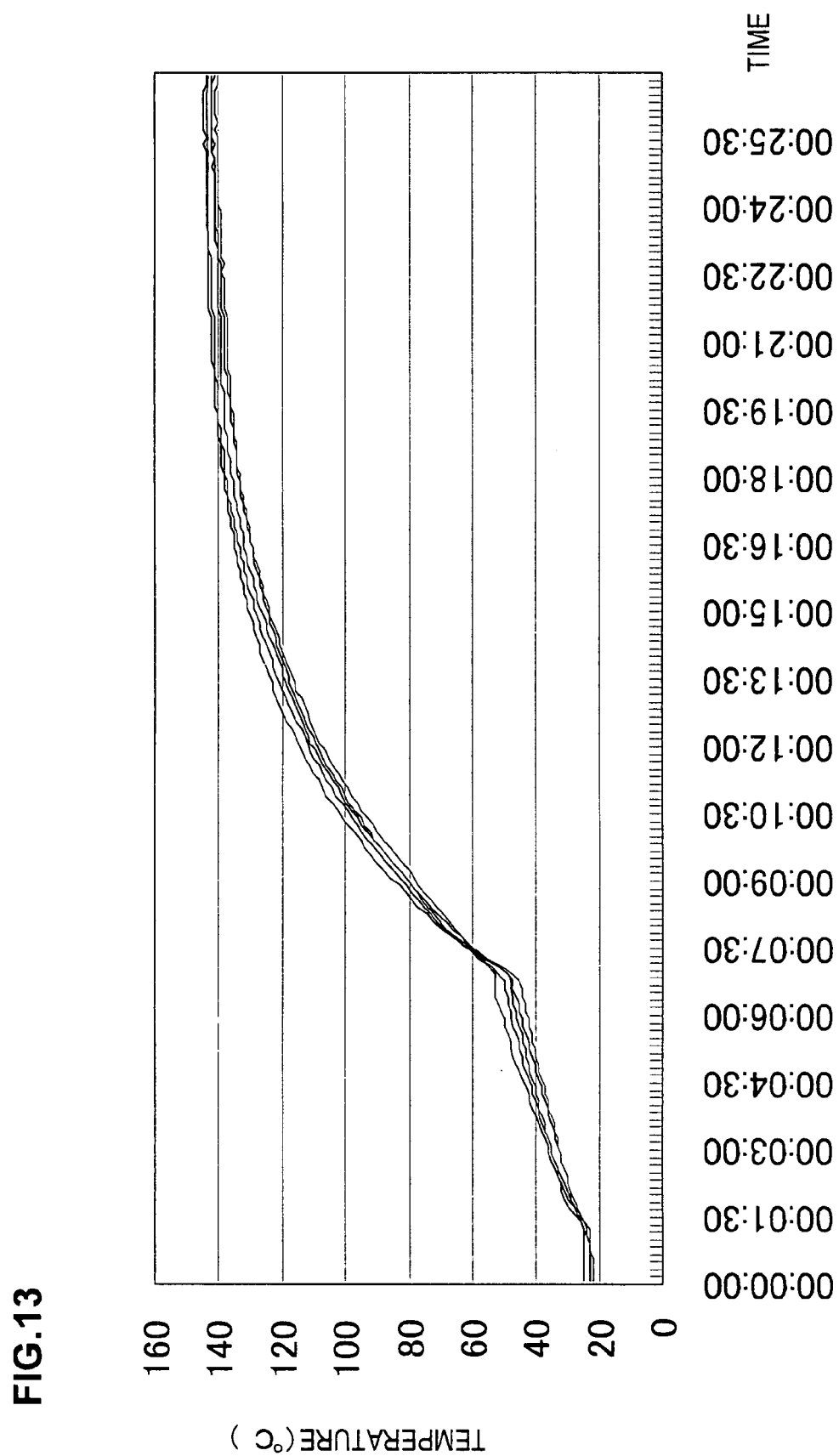
FIG. 13 is a graph showing temperature changes of solar battery modules during the laminating treatment, according to a comparative example.

Solar battery modules were actually laminated in the laminating apparatus described with reference to FIG. 1 and so on, with pre-heated air introduced into the upper chamber during the laminating treatment (example of the present invention), and with non-heated air (outside air) introduced into the upper chamber as it is (comparative example), and temperature changes of the solar battery modules during the laminating treatment in the both cases were studied. As a result, in the present invention (FIG. 12), the temperature reached from 65° C. to a bridging temperature 140° C. during a period from the start of the laminating treatment (about 6 minutes 30 seconds) to about 9 minutes later (about 15 minutes 30 seconds). On the other hand, in the comparative example (FIG. 13), the temperature reached from 55° C. to the bridging temperature 140° C. during a period from the start of the laminating treatment (about 7 minutes) to about 12 minutes later (about 19 minutes). When the temperature increase rates in the example of the present invention (FIG. 12) and the comparative example (FIG. 13) were compared, the former was about 8.3° C./min. and the latter was about 7° C./min. It is understood that the present invention can realize higher temperature increase rate and higher production ability than have conventionally been realized.

The present invention is especially useful as a laminating apparatus laminating an object to be laminated such as, for example, a translucent substrate, a filler, and a solar battery element to produce a solar battery module.

What is claimed is:

1. A laminating apparatus adapted for laminating an object to be laminated by which a fluid is introduced into an upper chamber demarcated by a diaphragm and the object to be laminated is placed on a heater panel and is sandwiched and pressed by the diaphragm expanded by the introduced fluid, the laminating apparatus comprising:
    a tank part in which the fluid to be introduced into the upper chamber is stored; and
    a heating mechanism heating the fluid stored in said tank part,
wherein a volume of said tank part is equal to a volume of the upper chamber or more, and said tank part is located on a downstream side of said heating mechanism and the upper chamber is located on a downstream side of said tank part, and the fluid, heated and stored in advance, is introduced into the upper chamber.

2. The laminating apparatus according to claim 1, wherein said heating mechanism is a heater heating the fluid in said tank part while circulating the fluid.

3. The laminating apparatus according to claim 1, wherein said heating mechanism is a heater attached to the tank part.

4. The laminating apparatus according to claim 1, wherein said tank part is disposed adjacent to the upper chamber.

5. The laminating apparatus according to claim 1, further comprising
    a lift mechanism lifting up/down the object to be laminated between a position on the heater panel and a position apart upward from the heater panel.

6. The laminating apparatus according to claim 1, wherein the object to be laminated is a solar battery module.

* * * * *